(12) United States Patent
Brederlow et al.

(10) Patent No.: US 8,124,475 B2
(45) Date of Patent: *Feb. 28, 2012

(54) INTEGRATED CIRCUIT ARRANGEMENT WITH CAPACITOR AND FABRICATION METHOD

(75) Inventors: Ralf Brederlow, Poing (DE); Jessica Hartwich, Neubiberg (DE); Christian Pacha, München (DE); Wolfgang Rösner, Ottobrunn (DE); Thomas Schulz, Austin, TX (US)

(73) Assignee: Infineon Technologies AG, Neubiberg (DE)

( * ) Notice: Subject to any disclaimer, the term of this patent is extended or adjusted under 35 U.S.C. 154(b) by 137 days.

This patent is subject to a terminal disclaimer.

(21) Appl. No.: 12/414,120

(22) Filed: Mar. 30, 2009

(65) Prior Publication Data

US 2009/0184355 A1 Jul. 23, 2009

Related U.S. Application Data

(60) Continuation of application No. 11/862,640, filed on Sep. 27, 2007, now Pat. No. 7,820,505, which is a division of application No. 10/529,990, filed as application No. PCT/DE03/03355 on Oct. 10, 2003, now Pat. No. 7,291,877.

(51) Int. Cl.
*H01L 21/8242* (2006.01)
(52) U.S. Cl. ............... 438/239; 438/251; 257/E21.011; 257/E21.654
(58) Field of Classification Search .................. 438/239, 438/251; 257/E21.011, E21.654
See application file for complete search history.

(56) References Cited

U.S. PATENT DOCUMENTS

| | | | |
|---|---|---|---|
| 6,160,269 A * | 12/2000 | Takemura et al. ............... 257/59 |
| 6,207,985 B1 | 3/2001 | Walker |
| 6,413,802 B1 | 7/2002 | Hu et al. |
| 7,414,288 B2 | 8/2008 | Ohtani |
| 7,820,505 B2 * | 10/2010 | Brederlow et al. ............ 438/239 |
| 2001/0014047 A1 | 8/2001 | Hidaka et al. |
| 2002/0125536 A1 | 9/2002 | Iwasa et al. |
| 2003/0001191 A1 | 1/2003 | Forbes et al. |
| 2003/0052336 A1 | 3/2003 | Yamazaki et al. |

FOREIGN PATENT DOCUMENTS

| | | |
|---|---|---|
| JP | 57176757 | 10/1982 |
| JP | 59222959 A | 12/1984 |
| JP | 61113271 | 5/1986 |
| JP | 62259466 | 11/1987 |
| JP | 03173175 | 7/1991 |
| JP | 07-045716 | 2/1995 |
| JP | 08-032040 | 2/1996 |
| JP | 08-125145 | 5/1996 |
| JP | 11-016344 | 1/1999 |
| JP | 11-340433 | 12/1999 |

(Continued)

OTHER PUBLICATIONS

U.S. Appl. No. 11/862,640, Office Action Dated Dec. 30, 2010.

(Continued)

*Primary Examiner* — Long Pham

(57) ABSTRACT

An integrated circuit arrangement contains an insulating region, which is part of a planar insulating layer, and a capacitor which contains: near and far electrode regions near and remote from the insulating region and a dielectric region. The capacitor and an active component are on the same side of the insulating layer, and the near electrode region and an active region of the component are planar and parallel to the insulating layer. The near electrode region is monocrystalline and contains multiple webs.

13 Claims, 9 Drawing Sheets

FOREIGN PATENT DOCUMENTS

| | | |
|---|---|---|
| JP | 2000-124412 | 4/2000 |
| JP | 2000-188378 | 7/2000 |
| JP | 2000-243973 | 9/2000 |
| JP | 2001-144175 | 5/2001 |
| JP | 2002-076297 | 3/2002 |
| JP | 2002-118255 | 4/2002 |
| WO | WO 2004/038770 | 5/2004 |

OTHER PUBLICATIONS

Final Office Action for U.S. Appl. No. 11/862,640 Dated Mar. 8, 2010.

International Examination Report from corresponding PCT patent application No. PCT/DE03/03355.

English International Examination Report from corresponding PCT patent application No. PCT/DE03/03355.

Translation of Japanese Office Action, Mailing Date Feb. 24, 2009, pp. 1-7.

Notice of Allowance for U.S. Appl. No. 11/862,640 Dated Jun. 16, 2010.

Office Action for U.S. Appl. No. 11/862,640 Dated Jun. 10, 2009.

\* cited by examiner

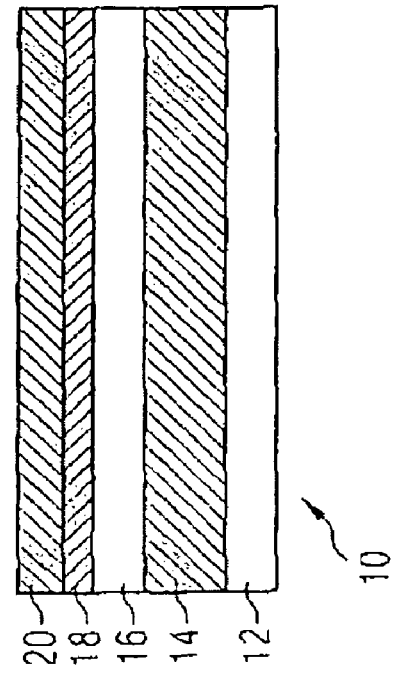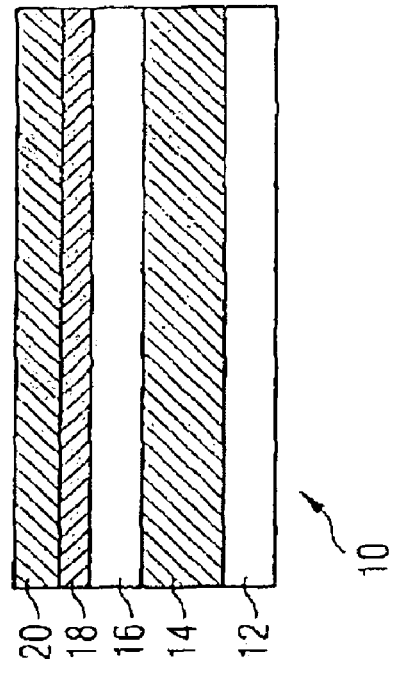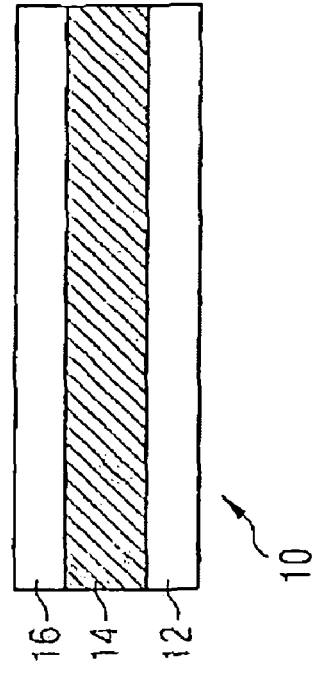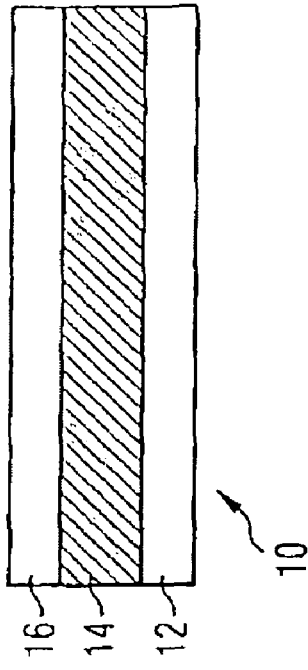

<br>

<br>

<br>

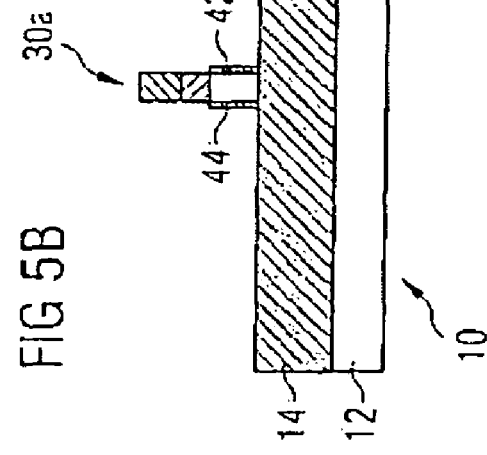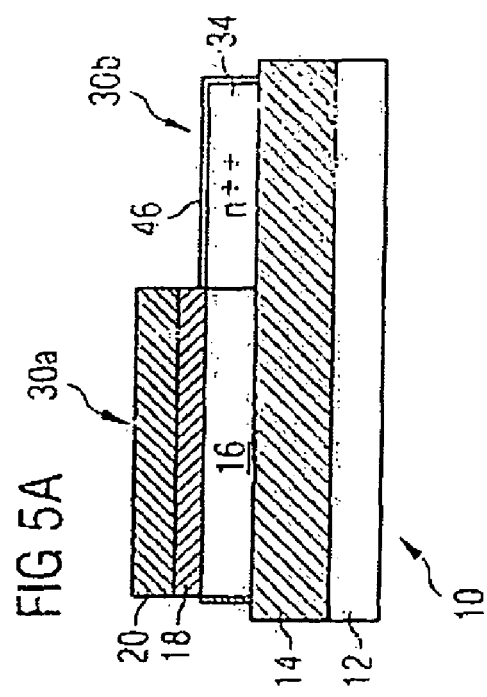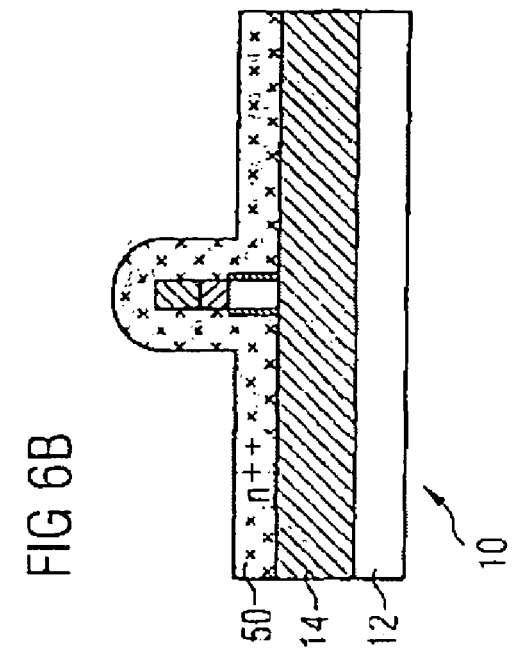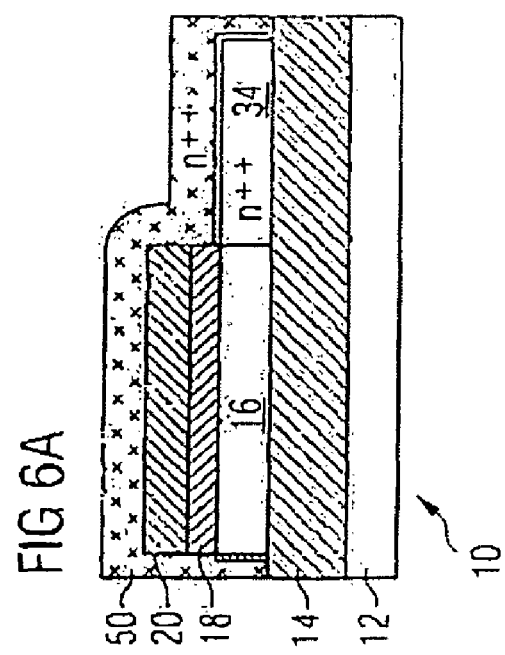

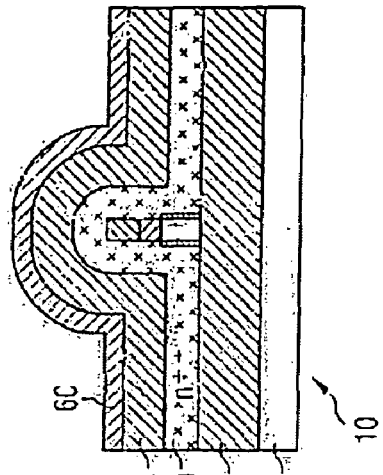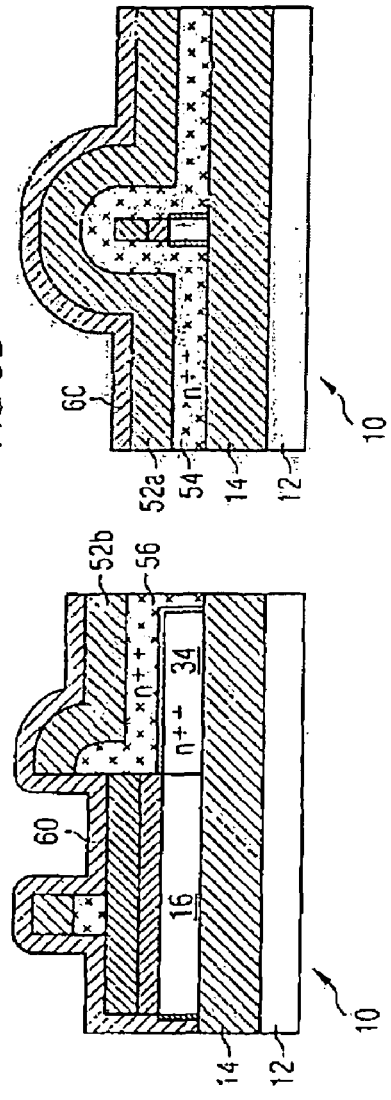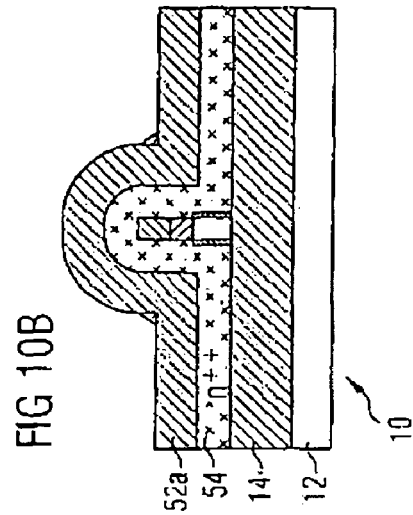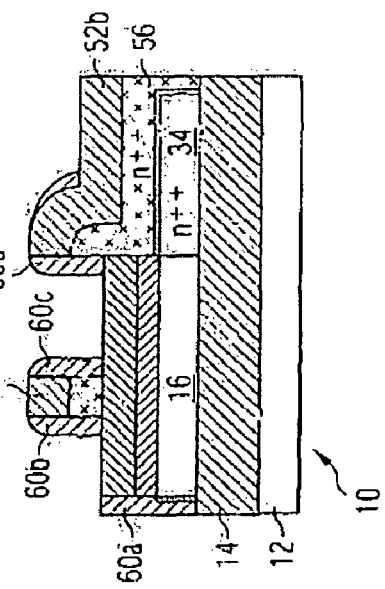

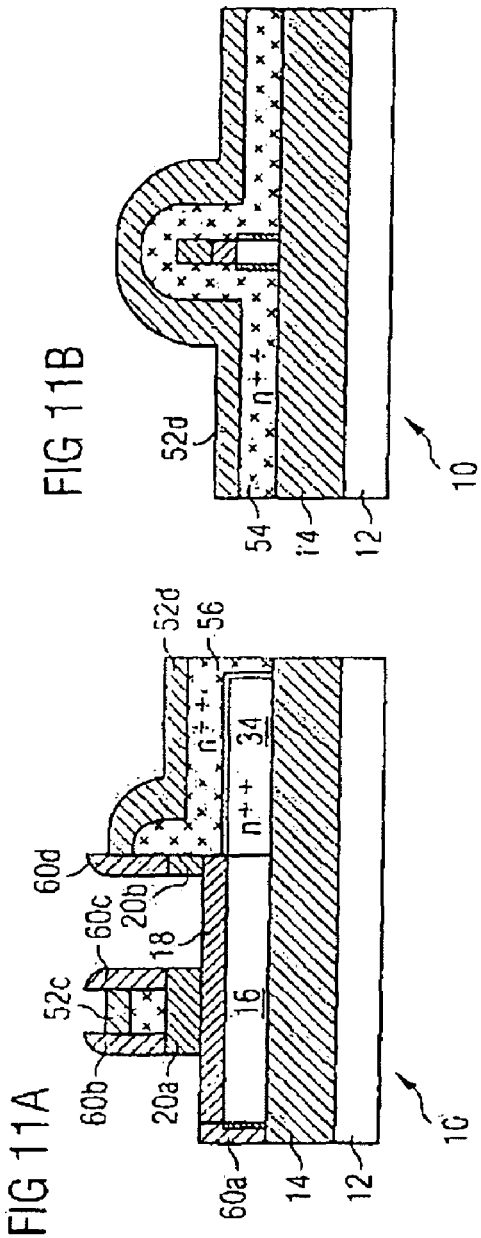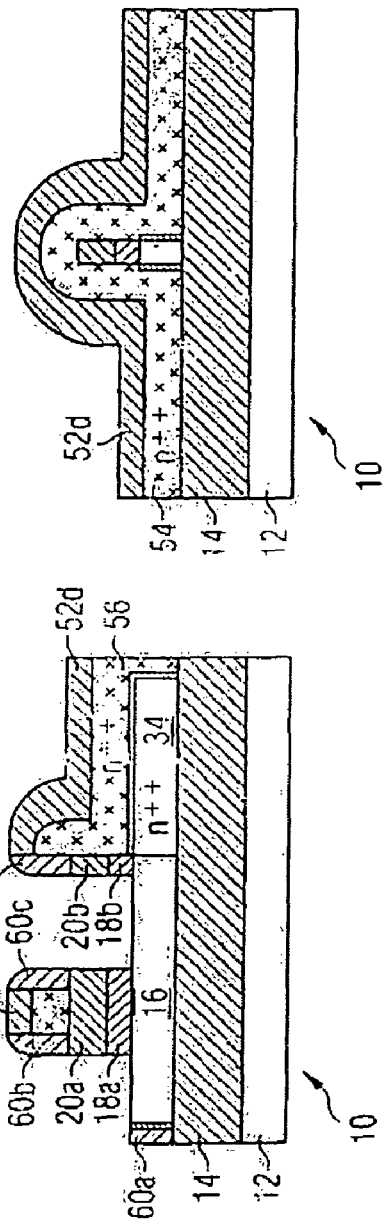

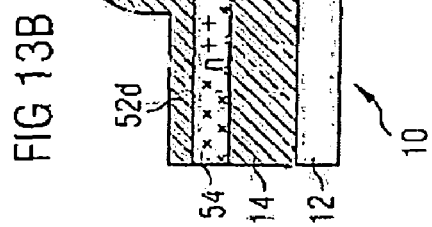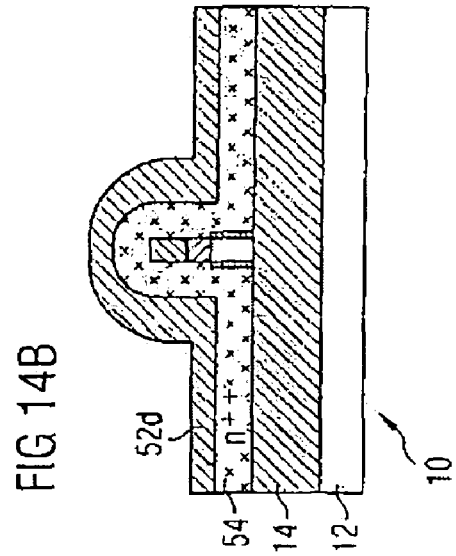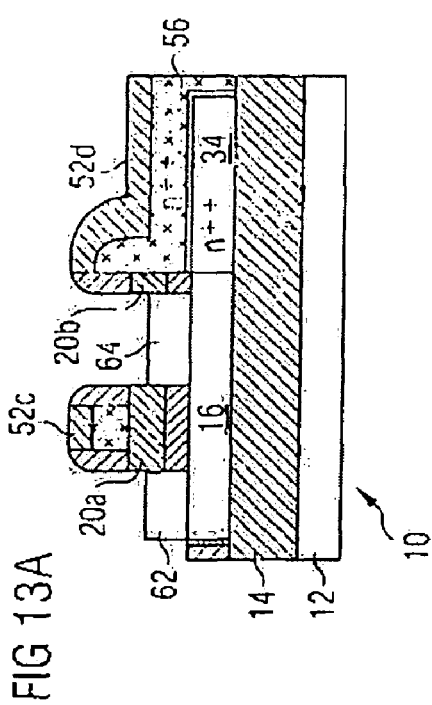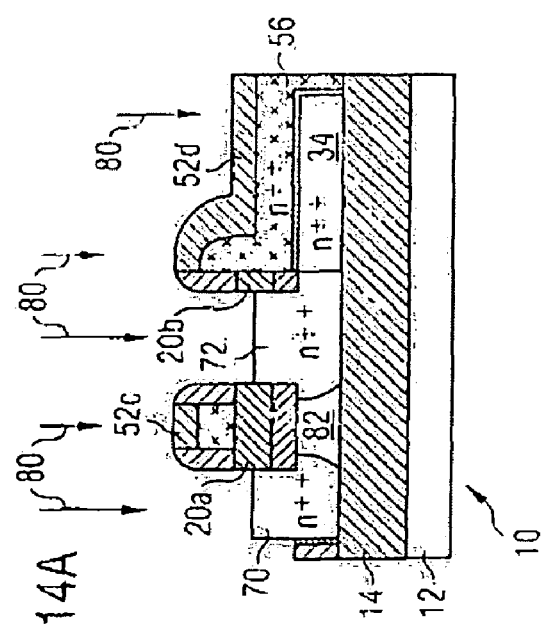

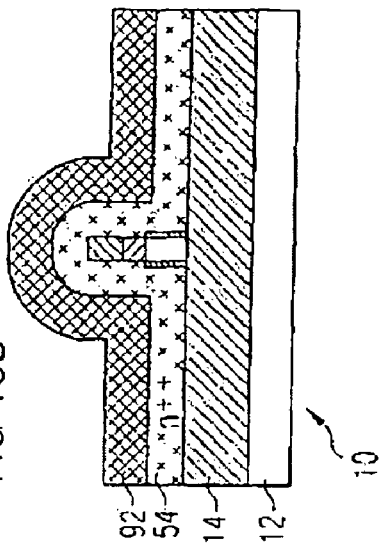
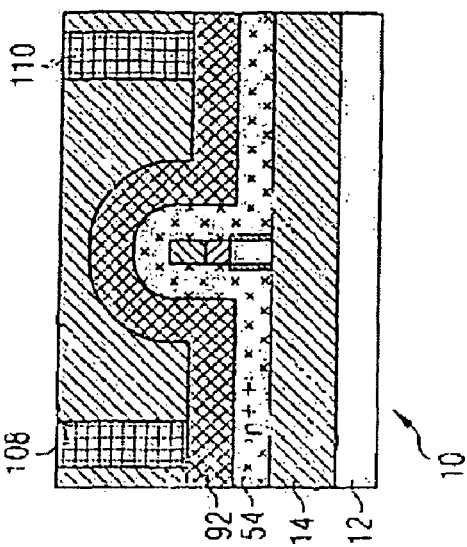
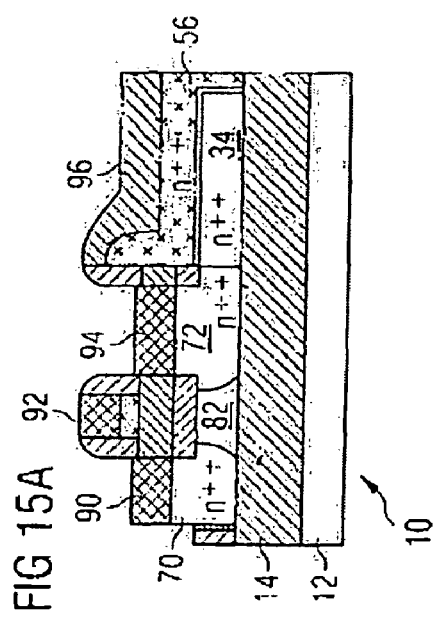
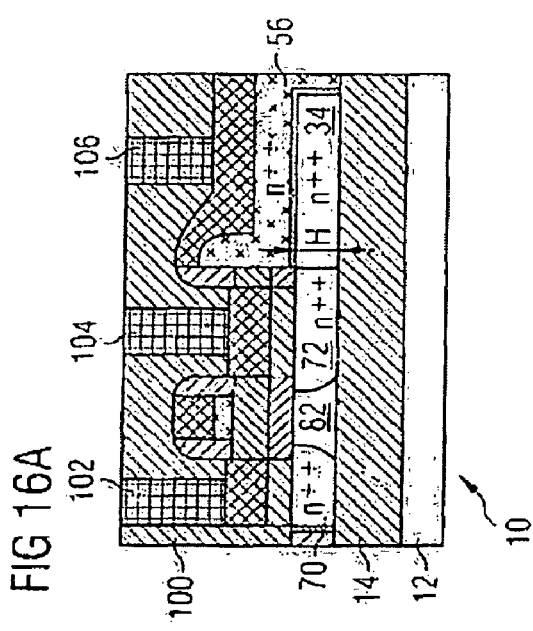

INTEGRATED CIRCUIT ARRANGEMENT WITH CAPACITOR AND FABRICATION METHOD

CROSS-REFERENCE TO RELATED APPLICATIONS

This application is a continuation application of U.S. Ser. No. 11/862,640 filed Sep. 27, 2007 now U.S. Pat. No. 7,820,505, which is a divisional of U.S. Ser. No. 10/529,990 filed on Mar. 31, 2005 now U.S. Pat. No. 7,291,877 which was a national stage application of international application number PCT/DE03/003355, filed on Oct. 10, 2003, which claims the benefit of priority to German Patent Application 102 48 722.7, filed on Oct. 18, 2002. This application hereby claims priority to and incorporates by reference each of the above identified applications.

BACKGROUND

The invention relates to an integrated circuit arrangement, which contains an electrically insulating region and at least one capacitor. The capacitor is formed from a sequence of regions which contains in the order specified:
an electrode region near the insulating region,
a dielectric region, and
an electrode region remote from the insulating region.

The electrically insulating region comprises, for example, an electrically insulating material having a resistivity of greater than $10^{12}$ Ωcm (ohm centimeters) at 20° C. room temperature, e.g. an oxide, in particular silicon dioxide. The electrode region contains, by way of example, a metal having an electrical resistivity of less than $10^{-4}$ Ωcm at 20° C. room temperature. As an alternative, the electrode regions contain polycrystalline silicon, for example, which is highly doped. The dielectric region likewise comprises an electrically insulating material, e.g. an oxide, in particular silicon dioxide, which has a dielectric constant of about 3.9. However, dielectric materials having a significantly larger dielectric constant are also used in the dielectric region.

SUMMARY

It is an object of the invention to specify a simple-to-fabricate integrated circuit arrangement with a capacitor. The intention is to enable the circuit arrangement to be fabricated in particular with a small number of process steps and in particular using a small number of lithographic masks. Moreover, the intention is to specify a simple fabrication method for an integrated circuit arrangement with a capacitor.

The object relating to the circuit arrangement is achieved by means of an integrated circuit arrangement having the features specified in patent claim 1. Developments are specified in the subclaims.

In the circuit arrangement according to the invention, the insulating region is part of an insulating layer arranged in a plane. The capacitor and at least one active component of the integrated circuit arrangement, preferably all the active components of the integrated circuit arrangement, lie on the same side of the insulating layer. Moreover, the electrode region near the insulating region and the active region of the component are arranged in a plane which lies parallel to the plane in which the insulating layer is arranged.

The circuit arrangement according to the invention is constructed in a simple manner and can be fabricated in a simple manner because the electrode region near the insulating region and the active region are situated in one plane. Moreover, the electrode region near the insulating region and also the active region are insulated by the insulating region. Freely selectable potentials can thus be applied to both electrode regions of the capacitor.

The capacitor additionally has outstanding electronic properties:
the ratio between parasitic capacitances and resistances in relation to the useful capacitance is small, different differential capacitances being attributable to space charge zones. In the case of analog capacitances, the differential capacitance is the capacitance which is effective at the operating point,
the leakage currents are small,
the differential nonlinearity of the capacitance is small,
the capacitance is constant over a wide operating point range,
the capacitance/area ratio that can be obtained is large, for example more than ten femtofarads per square micrometer or even greater than twenty femtofarads per square micrometer.

Moreover, no further layer or further layer sequence is necessary between the active components and the capacitor. This makes it possible to reduce the number of required layers and to increase the planarity of the integrated circuit arrangement.

In one development, the electrode region near the insulating region and the active region are semiconductor regions which contain a semiconductor material, i.e. a material having an electrical resistivity of between $10^{-5}$ and $10^{+12}$ Ωcm, in particular between $10^{-6}$ and $10^{+10}$ Ωcm, e.g. germanium, silicon or gallium arsenide. The resistivity of the electrode region of the capacitor which is near the insulating region is reduced by a doping in one configuration.

In one development of the circuit arrangement, the electrode region near the insulating region and the active region are monocrystalline regions which are doped, if appropriate. The electronic properties of active components in monocrystalline layers are particularly good. Moreover, the electrical resistance of a monocrystalline electrode of the capacitor can be reduced particularly well by doping. In one configuration, the electrode region near the insulating region and also the active region have a thickness of less than one hundred nanometers or even less than fifty nanometers. In such thin semiconductor layers, active components having a very short channel length can be produced in a particularly simple manner.

In a next development, the insulating layer adjoins a carrier substrate, as is the case with a so-called SOI substrate (Silicon On Insulator). Substrates of this type can be fabricated in a simple manner. Moreover, the electronic circuits arranged on these substrates have particularly good electronic properties.

In a next development, the dielectric region and the electrode region remote from the insulating region are arranged at least two side areas of the electrode region near the insulating region. This measure makes it possible to increase the capacitance of the capacitor in a simple manner. If the side areas are situated transversely with respect to the carrier substrate, then no or only a small additional chip area is required for increasing the capacitance. A further measure for increasing the capacitance consists in the electrode regions containing a multiplicity of intermeshing webs. The web height is preferably larger than the web width.

In another development, the active component is a field-effect transistor:
the channel region of the field-effect transistor is the active region. If the channel region is undoped, then particularly good electronic properties result in particular given very short channel lengths of ten nanometers, for example.

the control electrode of the field-effect transistor is part of a patterned electrode layer in which the electrode region of the capacitor which is remote from the insulating region is also arranged. The control electrode and the electrode region remote from the insulating region comprise the same material. The thickness of these regions and the dopant concentration thereof also correspond.

in one configuration, a control electrode insulation region of the field-effect transistor comprises the same material as the dielectric region of the capacitor. The thickness of these regions also corresponds.

This measure means that only three layer production processes are required for the fabrication of the capacitor and for fabricating the field-effect transistor. The regions of the field-effect transistor and of the capacitor which lie in the same layer can be patterned jointly. An additional mask for fabricating the capacitor is necessary only when the bottom electrode region of the capacitor is doped differently than the channel region of the field-effect transistor. A further additional mask is necessary only when the materials and/or the insulating thicknesses of the control electrode insulating region and of the dielectric region of the capacitor differ. Even then, however, the number of masks required for fabricating the circuit arrangement is still small.

In a next development, the field-effect transistor contains a web or a fin. Control electrodes are arranged at mutually opposite sides of the web. This results in a field-effect transistor having outstanding control properties, for example a so-called FinFET.

In one development, there is a connecting region which electrically conductively connects the control electrodes. In one configuration, the connecting region is isolated from the channel region by an insulating region whose insulating thickness is larger than the insulating thickness of the control electrode insulating region. These measures make it possible to avoid edge effects during the control of the transistor.

In another configuration, the control electrode adjoins a silicide region. This measure makes it easier to make contact with the control electrode. The contact resistance and the sheet resistance are additionally reduced.

In a next development of the circuit arrangement according to the invention, terminal regions of the field-effect transistor adjoin the insulating layer. In one configuration, the terminal regions likewise adjoin silicide regions. Sufficient material for the silicide formation is present when the semiconductor layer, both before and after the silicide formation, has a larger thickness in the region of the terminal regions than in the region of the electrode near the insulating region.

In a next development, spacers are arranged on both sides of the control electrodes, which spacers also contain a different material or comprise a different material than the electrode layer, in particular a material which is not suitable as a starting point for an epitaxial layer growth during an epitaxy method for producing a semiconductor epitaxial layer, for example silicon nitride. The use of spacers means that side regions of the control electrode are covered, so that no epitaxy can proceed from there and short circuits are avoided.

In one configuration, a spacer is likewise arranged at least one side of the electrode region remote from the insulation region. The spacers have fulfilled the same task as the spacers arranged at the control electrode. If a spacer arranged at the gate and a spacer arranged at an electrode of the capacitor touch one another, then a masking arises which, by way of example, prevents a doping or else a siliciding in the masked region.

In a next development, a terminal region of the field-effect transistor and the electrode region of the capacitor which is near the insulating region adjoin one another and thus form an electrically conductive connection. This results in a simply constructed memory cell of a DRAM (Dynamic Random Access Memory), without necessitating additional measures for making contact with the electrode near the insulating region.

In one development, that side of the electrode region near the insulating region which adjoins one terminal region of the transistor is longer than a side of the electrode region near the insulating region which lies transversely with respect to said side, preferably being at least twice as long or at least five times as long. In this case, the transistor has a transistor width which is a multiple of the minimum feature size, preferably more than three-fold or more than five-fold. These measures result in a particularly low-impedance connection between the transistor and the capacitor. This leads to the improvement of the electronic properties particularly in so-called analog capacitances in analog circuits. Examples of such analog circuits are analog-to-digital converters. Another example of an analog capacitance is a so-called bypass capacitance which can be used to smooth voltage spikes on an operating voltage line or a signal line.

In an alternative development, by contrast, a side of the electrode region near the insulating region which lies transversely with respect to that side of the electrode region near the insulating region which adjoins the terminal region is longer than the side adjoining the terminal region, preferably at least twice as long or at least five times as long. In this case, the transistor has a transistor width which is less than three times the minimum feature size, preferably less than twice the minimum feature size. What is achieved by this measure particularly in the case of memory cells is that the nonreactive resistance of the bottom electrode of the capacitor is increased and a fast discharge of the storage capacitance is thus counteracted.

In another development, the circuit arrangement contains at least one processor containing a multiplicity of logical switching functions. If, in one configuration, the circuit arrangement additionally contains a multiplicity of DRAM memory units (Dynamic Random Access Memory) beside the processor, then a term that is also used is an embedded memory. In order to fabricate this circuit arrangement, in addition to the process steps and masks that are necessary anyway for fabricating the logic, only a small number of additional process steps and additional masks are required for fabricating the capacitor or the transistors that are electrically conductively connected thereto.

The invention additionally relates, in a further aspect, to a method for fabricating an integrated circuit arrangement, in particular for fabricating the circuit arrangement according to the invention or one of its developments. In the method according to the invention, the following method steps are performed without any restriction by the order specified:

provision of a substrate containing an insulating layer made of electrically insulating material and a semiconductor layer, e.g. an SOI substrate, patterning of the semiconductor layer in order to form at least one electrode region for a capacitor and in order to form at least one active region of a transistor, after the patterning of the semiconductor layer production of a dielectric layer, after the production of the dielectric layer production of an electrode layer, and formation of an electrode of the capacitor which is remote from the insulating region and of a control electrode of the transistor in the electrode layer.

The method according to the invention is particularly suitable for fabricating a so-called FinFET together with the capacitor. The abovementioned technical effects of the circuit arrangement according to the invention and of its developments also apply to the method according to the invention and the developments thereof.

BRIEF DESCRIPTION OF THE DRAWINGS

FIGS. 1A to 16B show fabrication stages in the fabrication of an integrated DRAM memory cell.

DETAILED DESCRIPTION

Figure 3A:
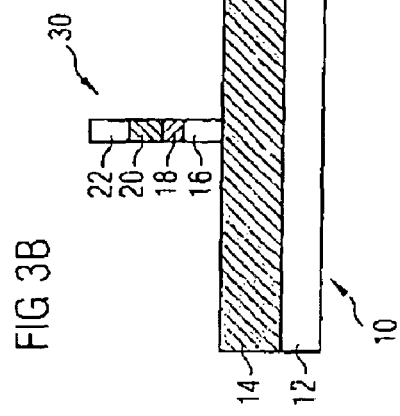

FIGS. 1A to 16B show fabrication stages in the fabrication of an integrated memory cell, FIGS. 1A to 16A relating to a section along a sectional plane I, which lies longitudinally with respect to a channel of a field-effect transistor, in particular longitudinally with respect to the current flow direction in the channel. FIGS. 1B to 16B in each case relate to the section along a sectional plane II, which lies transversely with respect to the channel.

The fabrication of the memory cell begins proceeding from an SOI substrate 10, which contains a carrier substrate 12 made of monocrystalline silicon, a so-called buried insulating layer 14 made of silicon dioxide, for example, and a thin semiconductor layer 16 made of monocrystalline silicon. In the exemplary embodiment, the thickness of the carrier substrate 12 is five hundred and fifty micrometers, the thickness of the insulating layer 14 is one hundred nanometers and the thickness of the semiconductor layer 16 is fifty nanometers. In the fabrication stage illustrated in FIG. 1A, there are as yet no differences along the sectional plane I and II, respectively, see FIG. 1B.

As illustrated in FIGS. 2A and 2B, a silicon nitride layer 18 is subsequently deposited into the SOI substrate 10, for example with the aid of a CVD method (Chemical Vapor Deposition). In the exemplary embodiment, the silicon nitride layer 18 has a thickness of fifty nanometers. A silicon dioxide layer is then deposited over the whole area of the silicon nitride layer 18, e.g. a TEOS layer 20 (tetraethyl orthosilicate) with the aid of a TEOS method. In the exemplary embodiment, the TEOS layer 20 has a thickness of seventy-five nanometers. Identical conditions are still present along the sectional planes I and II, see FIG. 2B.

In another exemplary embodiment, the double layer comprising the silicon nitride layer 18 and the TEOS layer 20 is replaced by a single layer. This results in a process simplification.

Figure 3B:
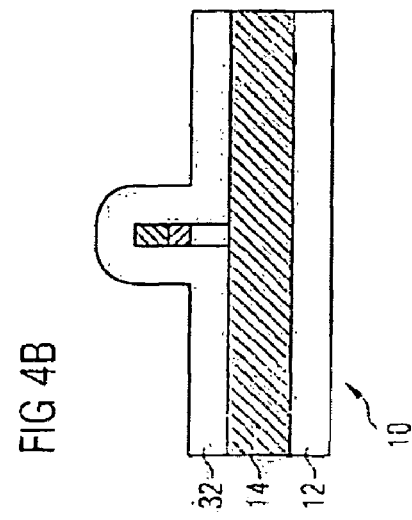

As illustrated in FIGS. 3A and 3B, a lithography method is subsequently carried out. To that end, a photoresist 22 is applied over the whole area, exposed in accordance with a predetermined layout and developed. Afterward, the TEOS layer 20, the nitride layer 18 and the semiconductor layer 16 are patterned, for example by means of a dry etching method. This results in a layer stack 30 or mesa which tapers, in the region of the sectional plane II, to form a web region, see FIG. 3B, and then widens again. The geometry for the field-effect transistor to be fabricated and the geometry for the capacitor can be prescribed and thus optimized independently of one another.

The photoresist 22 is subsequently removed. As an alternative to a photolithographic method, in another exemplary embodiment, an electron beam lithography method or another suitable method is carried out.

Figure 4A:
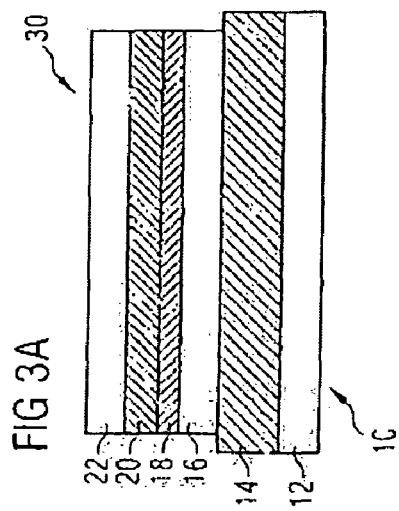
Figure 4B:
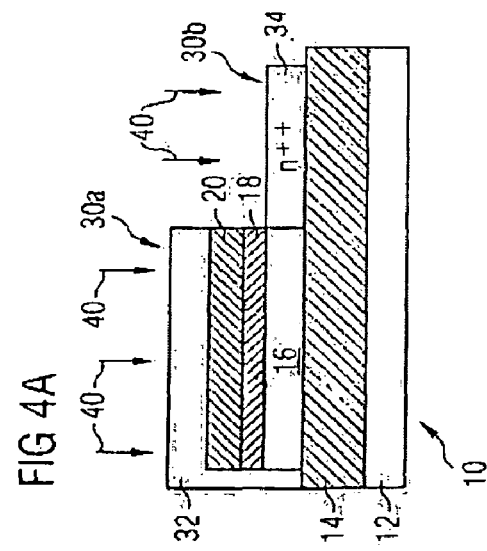

As illustrated in FIGS. 4A and 4B, a further photolithography method is subsequently performed, in which an additional mask is necessary for fabricating the capacitor. A photoresist layer 32 is applied, exposed using the mask, developed and patterned. During the patterning, the TEOS layer 20 and the silicon nitride layer 18 are removed above a bottom electrode region 34 in the semiconductor layer 16. As a result, the stack 30 is divided into a transistor part 30a and into a capacitor part 30b.

Afterward, an ion implantation is carried out using the patterned photoresist layer 32, the bottom electrode region 34 being heavily n-doped, represented by $n^{++}$ and by implantation arrows 40 in FIG. 4A. The semiconductor layer 16 is not doped in the region provided for the transistor. The bottom electrode region 34 acquires low impedance as a result of the additional implantation. By way of example, the doping density amounts to $10^{20}$ doping atoms per cubic centimeter. The doping density preferably lies in the range of between $10^{19}$ and $10^{21}$ doping atoms per cubic centimeter. As the doping density increases, the dielectric grows more rapidly than on undoped or only medium-heavily doped regions. However, as the doping density increases, the space charge zones that form become smaller, so that parasitic effects likewise become smaller.

The later channel region of the transistor, in particular the side areas of this channel region, are protected by the photoresist layer 32, so that zones which might effect a doping do not penetrate into these regions.

As illustrated in FIGS. 5A and 5B, the photoresist layer 32 is subsequently removed. A thin oxide layer is subsequently produced at all the uncovered sides of the semiconductor layer 16 and, in particular, also at the uncovered sides of the bottom electrode region 34, which oxide layer forms the gate oxide 42 and 44 in the region of the transistor and a dielectric 46 in the region of the capacitor. By way of example, the oxide layer grows thermally. In the exemplary embodiment, the oxide layer has a thickness of two nanometers in the region of the undoped silicon.

In an alternative exemplary embodiment, using a further lithography method, a dielectric made of a different material and/or a dielectric having a different thickness than in the region provided for the transistor is produced in the region of the capacitor.

As illustrated in FIGS. 6A and 6B, in-situ or subsequently doped polycrystalline silicon is then deposited, a polysilicon layer 50 being produced. The polysilicon layer 50 has, by way of example, a thickness of one hundred nanometers and a dopant concentration of $10^{21}$ doping atoms per cubic centimeter. The heavy doping of the n conduction type is once again represented by the symbol $n^{++}$. Phosphorus atoms, for example, are used as doping atoms.

Figure 7A:
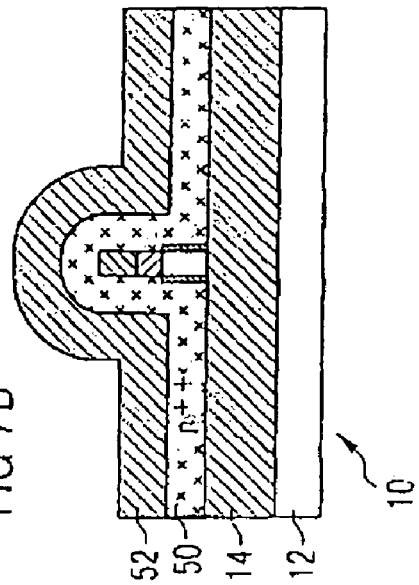
Figure 7B:
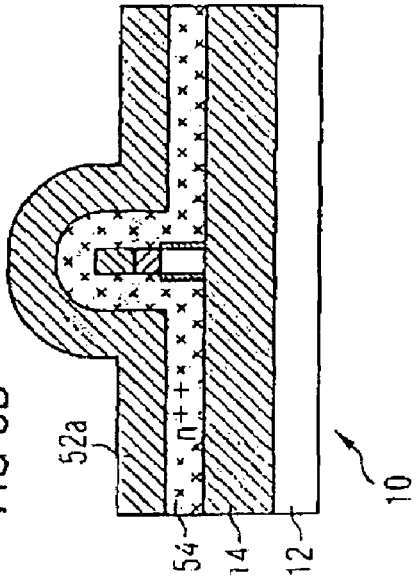

As shown in FIGS. 7A and 7B, a further TEOS layer 52, which is thicker than the TEOS layer 20, is subsequently deposited onto the polysilicon layer 50. In the exemplary embodiment, the thickness of the TEOS layer 52 amounts to one hundred nanometers.

The TEOS layer 52 has a dual function. As will be explained further below, the TEOS layer 52 firstly serves as a hard mask for the patterning of the control electrode (gate) of the transistor. Afterward, the TEOS layer 52 serves as an implantation mask which prevents repeated doping of the gate electrode. In this way, it is possible for gate electrode and source/drain regions to be doped differently. The gate electrode work function can thus be chosen freely.

Figure 8A:
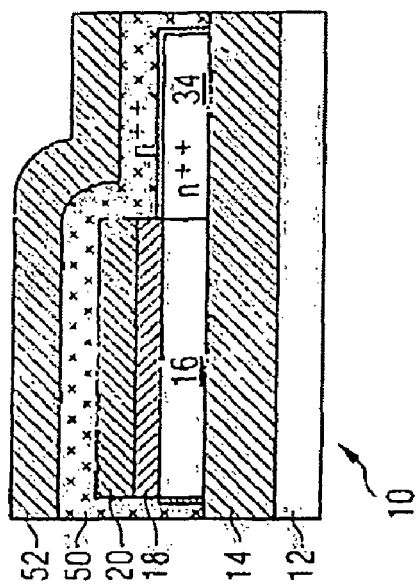
Figure 8B:
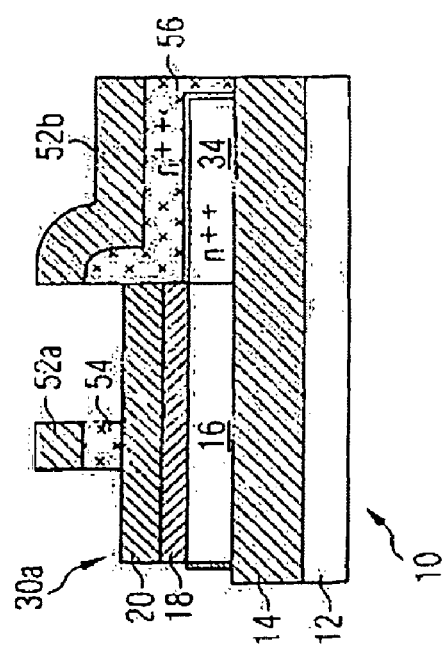

As shown in FIGS. 8A and 8B, a further lithography method is subsequently carried out for patterning a gate electrode 54. To that end, a photoresist layer (not illustrated in the figures) is once again applied, exposed and developed. Afterward, the TEOS layer 52 and the polysilicon layer 50 are patterned, for example etched. This results in the gate electrode 54 in the region of the transistor and a covering electrode 56 in the region of the capacitor. The gate electrode 54 is covered by a TEOS layer region 52a. The covering electrode 56 is covered by a TEOS layer region 52b. The etching stops on the TEOS layer 20. A significant degree of overetching is effected during the etching of the polysilicon layer 50 in order to remove all the parasitic polysilicon spacers at the sidewalls of the layer stack 30a. The sidewalls are covered only by the thin oxide layer after the etching.

As shown in FIGS. 9A and 9B, a thin silicon nitride layer 60 is subsequently deposited over the whole area, for example with the aid of a CVD method. The silicon nitride layer 60 has a thickness of fifty nanometers in the exemplary embodiment.

As illustrated in FIGS. 10A and 10B, the silicon nitride layer 60 is subsequently etched back in an anisotropic etching process to form spacers 60a at the sidewalls of the transistor part 30a, spacers 60b, 60c at the sidewalls of the gate electrode 54 and of the TEOS layer region 52a and also to form a spacer 60d at the sidewalls of the covering electrode 56 and of the TEOS region 52b.

As illustrated in FIGS. 11A and 11B, the thin TEOS layer 20 is then etched without using a lithography method, i.e. in a self-aligning manner, for example by means of an RIE method (reactive ion etching). A TEOS layer region 20a is produced below the spacers 60b, 60c and below the gate electrode 54. A TEOS layer region 20b is produced below the spacer 60d. During the etching, the TEOS layer regions 52a and 52b are also thinned, for example to twenty-five nanometers. This produces thinned TEOS layer regions 52c above the gate electrode 54 and 52d above the covering electrode 56. As a result of the etching, moreover, the silicon nitride layer 18 is uncovered in regions which are not covered by the TEOS layer region 20a. The spacers 60a to 60d are not attacked by the etching of the TEOS layer 52, so that they project somewhat beyond the thinned TEOS layer regions 52c and 52d.

As shown in FIGS. 12A and 12B, the nitride layer 18 is subsequently patterned in a self-aligning manner, uncovered regions of said silicon nitride layer 18 being removed. A nitride layer region 18a remains below the TEOS layer region 20a. A nitride layer region 18b remains below the TEOS layer region 20b. Etching is effected for example by means of an RIE method (reactive ion etching). The spacers 60a to 60d are also shortened in the process. The layer thicknesses and etchings are dimensioned such that the gate electrode 54 is still surrounded at the sides by the spacers 60b and 60c after the etching of the silicon nitride layer 18. From above, the gate electrode 54 is furthermore masked by a sufficiently thick TEOS layer, for example a TEOS layer 52c having a thickness of twenty-five nanometers. The source/drain regions are uncovered after the etching of the silicon nitride layer 18.

The spacers 60b and 60c now terminate with the upper surface of the TEOS region 52c. The spacer 60d terminates with the upper surface of the TEOS layer region 52d.

As illustrated in FIGS. 13A and 13B, a selective epitaxy method is subsequently carried out. A monocrystalline epitaxial layer grows only on the uncovered source/drain regions of the semiconductor layer 16. Epitaxial regions 62 and 64 are produced on monocrystalline silicon. The epitaxial regions 62 and 64 extend approximately up to half the height of the TEOS layer regions 20a and 20b. The epitaxial regions 62 and 64 are also referred to as "elevated" source/drain regions. The thickness of the epitaxial layer for the epitaxial regions 62 and 64 primarily depends on the thickness of the semiconductor layer 16 and the siliciding explained below. The siliciding consumes silicon that is present, with the result that a correspondingly large amount of silicon is provided for the reaction. This measure prevents a "tearing away" of the channel terminals in the region of the drain/source region.

As shown in FIGS. 14A and 14B, after the epitaxy method, an ion implantation, e.g. $n^{++}$, i.e. heavily n-doped, is carried out in order to fabricate the highly doped source/drain regions 70 and 72, see implantation arrows 80. A mask is necessary here merely for separating regions with complementary transistors in a CMOS process (complementary metal oxide semiconductor). The epitaxial regions 62, 64 and the underlying regions of the semiconductor layer 16 are $n^{++}$ doped in low-impedance fashion as a result of the implantation. Moreover, in this case, a connection is produced between the source/drain region 72 and the bottom electrode region 34 of the capacitor. A channel region 72 lying between the source/drain regions 70 and 72 in the semiconductor layer 16 remains undoped.

The TEOS layer regions 52c and 52d serve as an implantation mask during the implantation. The dopings of the gate electrode 54 and of the covering electrode 56 are therefore not changed during the implantation.

As illustrated in FIGS. 15A and 15B, the remnants of the TEOS layer 52, i.e. in particular the TEOS layer regions 52c and 52d, are etched away after the HDD implantation (high density drain). A salicide method (self-aligned silicide) is subsequently carried out. To that end, by way of example, a nickel layer is deposited over the whole area. At temperatures of 500° C., for example, nickel silicide forms on the epitaxial regions 62, 64, on the gate electrode 54 and on the covering electrode 56, see silicide regions 90 to 96. Instead of nickel, it is also possible to use a different metal with a melting point of more than 1200 degrees Celsius, in particular a refractory metal, in order e.g. to fabricate titanium silicide or cobalt silicide.

As illustrated in FIGS. 16A and 16B, a passivation layer 100 is subsequently applied, for example made of silicon dioxide. Contact holes are etched into the passivation layer 100 and filled with tungsten, for example, thus producing connecting sections 102, 104, 106, 108 and 110 which lead in this order to the silicide region 90, 94, 96 and 92, respectively. In another exemplary embodiment, only one connecting section is provided instead of the two connecting sections 108 and 110 leading to the silicide region 92. The connecting sections 102 to 110 are subsequently also connected to interconnects of a metallization layer or a plurality of metallization layers. A conventional CMOS process, also referred to as "back end", is performed in this case.

Figure 17:
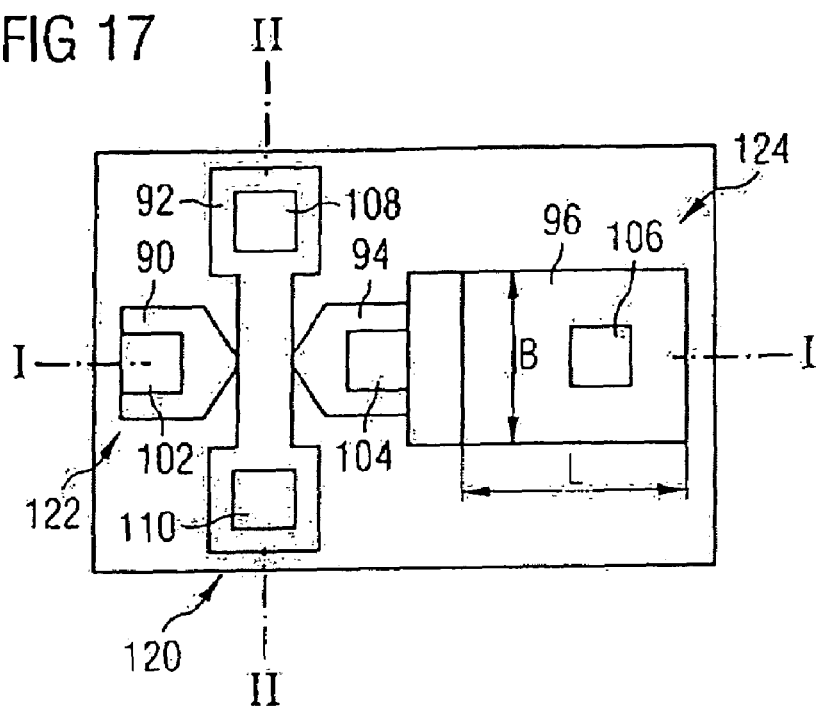
FIG. 17 shows a plan view of the memory cell.

FIG. 17 shows a plan view of the memory cell 120, which contains a FinFET 122 and a capacitor 124. The capacitor 124 is shown reduced in size in relation to the transistor 122 in all of FIGS. 1A to 17.

The effective area of the capacitor 124 results as follows:

$$A = L \cdot B + H \cdot (2 \cdot L + B),$$

where A is the effective area, B is the width of the capacitor, L is the length of the capacitor, and H is the height of the bottom electrode region 34 as depicted in FIG. 16A.

A preferred area of application for such an embedded DRAM capacitance is the replacement of medium-sized SRAM memory units by a fast embedded DRAM, for example in the second and third access levels of a microprocessor memory hierarchy, i.e. in the second and third level cache. By way of example, hitherto an SRAM memory cell has had an area of 134 $F^2$, where F is the minimum feature size. If a dielectric having a dielectric constant Fr equal to twenty-five is used, by way of example, e.g. tantalum pentoxide, then it is possible to realize a typical embedded DRAM capacitance CMEM of twenty femtofarads per memory cell in accordance with the following calculations. The oxide capacitance amounts to:

$$COX=\epsilon_r\epsilon_0/tphys=110 \text{ fF}/\mu m^2,$$

where tphys is the oxide thickness, amounting to two nanometers in the exemplary embodiment. This results in a required area AMEM of the storage capacitance of:

$$AMEM=CMEM/COX\sim 0.18 \ \mu m^2.$$

For a minimum feature size F equal to fifty nanometers, this corresponds to 72 $F^2$ for the capacitance. This area can be produced for example with a parallelepipedal bottom electrode region 34 having a base area of L·B=8 F·6 F. where the height H is equal to 1 F. This corresponds to an area reduction by thirty-three percent relative to a planar SOI process. This area gain increases for higher heights H. Including the access transistor, a total area of the FinFET-capacitance arrangement of 68 $F^2$ results, the FinFET 122 being embodied with a gate contact. The area of the embedded DRAM memory cell is thus less than the SRAM cell size of 134 $F^2$.

In the case of the invention, a capacitance is integrated into the FET plane, that is to say into the so-called top silicon on an SOI substrate. In contrast to SOI-CMOS technologies with planar, fully depleted SOI transistors, however, a FinFET is used, which has better control properties on account of the two control channels at the sidewalls. The fabrication of the SOI capacitance requires only one additional process step if the particularly high-quality gate dielectric of the transistor is utilized as the dielectric of the capacitor.

Given an effective oxide thickness of one nanometer, a correction of 0.8 nanometer for the gate and top silicon depletion and on account of the quantum mechanical effects, there results a capacitance per area of:

$$COX=3.9\epsilon_0/tfox=19 \text{ fF}/\mu m^2,$$

where tfox equal to 1.8 nanometers denotes the electrically effective oxide thickness and $\epsilon_0$ denotes the permittivity of free space. Given the use of a metal gate, the electrically effective oxide thickness decreases by about 0.4 nanometer on account of the gate depletion that is no longer present, as a result of which the capacitance per area increases to:

$$COX=3.9 \ \epsilon_0/tfox=24 \text{ fF}/\mu m^2.$$

The capacitances according to the invention are also used as so-called bypass capacitances for attenuating so-called spikes and for attenuating crosstalk in the voltage supply of the integrated circuit arrangement. They are also highly suitable as analog capacitances, in particular in oscillators or analog-to-digital converters. The capacitances are also used for so-called mixed-signal circuits, i.e. for circuits having analog capacitances and e.g. storage capacitances in memory cells.

In other exemplary embodiments, a separate high-K DRAM dielectric where $\epsilon_r$ is greater than one hundred is used instead of the gate oxide. For example a dielectric containing barium strontium titanate (BST) or epitaxial barium strontium titanate. The area requirement thus decreases to approximately 22 $F^2$. A second additional mask is used to define the region for the high-K dielectric on the SOI stacks.

Further advantages that are afforded over previous technological concepts are a planar transition between pure logic blocks and embedded DRAM blocks. Furthermore, deep vias and contacts are avoided.

The low leakage current in FinFET transistors and also the lower parasitic capacitances, which increase the proportion of the useful capacitance in the total capacitance, additionally lead to a further reduced embedded DRAM capacitance of CMEM equal to ten femtofarads.

No LDD doping (lightly doped drain) was carried out in the exemplary embodiment explained with reference to FIGS. 1A to 17. In another exemplary embodiment, an LDD doping is also carried out in addition to the HDD doping.

In a further exemplary embodiment, a transistor and the capacitor are arranged spatially further away from one another and respectively connected to dedicated connecting sections.

Particularly in the case of DRAM memory cells (dynamic random access memory) with only one transistor, the connecting section 104 is not necessary. The spacers 60c and 60d can then touch one another so that they serve as a mask during the doping of the terminal region 70 and during the selective siliciding. A terminal region then forms below the spacers 60c and 60d through outdiffusion of doping atoms from the bottom electrode region 34.

Figure 18:
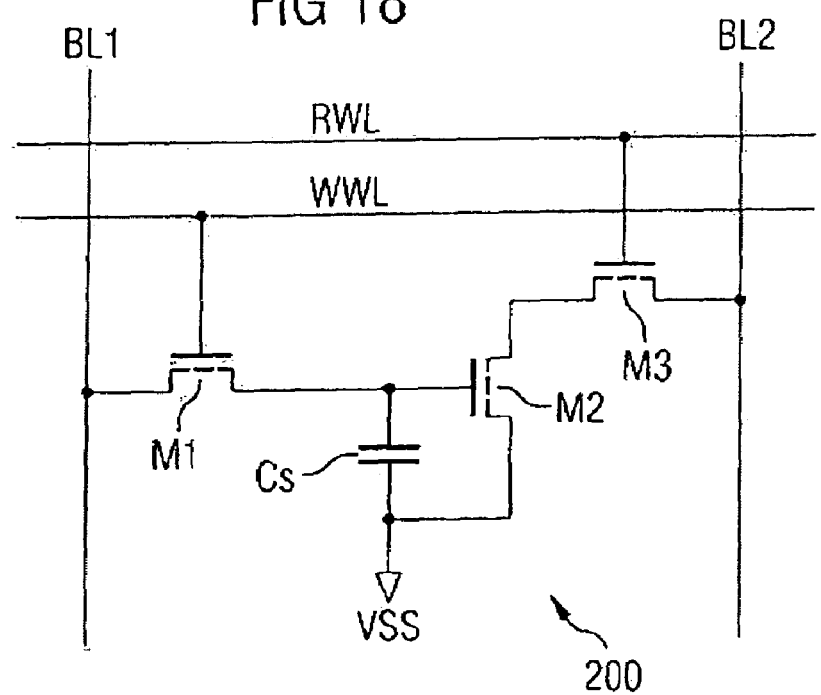
FIG. 18 shows a plan view of a DRAM memory cell with three transistors.

FIG. 18 shows a circuit diagram of a DRAM memory cell 200 (Dynamic Random Access Memory) having three transistors M1 to M2 and also having a capacitor Cs, which have been fabricated by means of the method steps explained with reference to FIGS. 1A to 16A. By way of example, the transistor 122 illustrated in FIG. 17 is the transistor M1 in a first case. The capacitor 124 is then the capacitor Cs. In the first case, an electrically conductive connection leads from an additional pad adjoining the bottom electrode region 34 in the semiconductor layer 16 or from the connection section 104 to the gate of the transistor M2.

As an alternative, the layout in a second case is chosen such that the transistor 122 corresponds to the transistor M2, the capacitor 124 again corresponding to the capacitor Cs. In the second case, the covering electrode 56 is electrically conductively connected to one terminal region of the transistor M1 and to the gate of the transistor M2.

The circuit of the memory cell 200 contains a subcircuit for writing and a subcircuit for reading, the charge of the capacitor Cs not being altered during the reading process, with the result that it is also not necessary to refresh this charge after a reading operation.

The subcircuit for writing contains the writing transistor M1 and the capacitor Cs. The gate terminal of the transistor M1 is connected to a write word line WWL. The source terminal of the transistor M1 is connected to a write bit line BL1. In the case of a circuit arrangement having particularly good electrical properties in accordance with the first case mentioned above, the drain terminal of the transistor M1 leads to a storage node X, which is formed by the bottom electrode 34 of the capacitor 124. The covering electrode 56 of the capacitor Cs is at a ground potential VSS. In the alternative in accordance with the second case, the drain terminal of the transistor M1 leads to a storage node X formed by the covering electrode 56 of the capacitor 124. The bottom electrode 34 of the capacitor Cs is at a ground potential VSS.

The subcircuit for reading contains the transistors M2 and M3. The gate terminal of the transistor M3 is connected to a read word line RWL. The drain terminal of the transistor M3 is connected to a read bit line BL2, which is charged to an operating potential VDD, for example, before the beginning of the reading operation. The source terminal of the transistor M3 is connected to one drain terminal of the transistor M2. The gate terminal of the transistor M2 is connected to the storage node X. The source terminal of the transistor M2 is at the ground potential VSS.

The transistor M2 performs the task of an amplifier, so that reliable reading is still possible even in the event of charge losses on the storage node X. If there is a positive charge on the storage node X, then the transistor M2 is in the switched-on state and the precharged read bit line BL2 is discharged during the reading operation.

Since the gate-source capacitance of the transistor M2 is connected in parallel with the capacitor Cs, the effective storage capacitance Ceff increases:

Ceff=Cs+CGS(M2), where Cs is the capacitance of the capacitor Cs and CGS is the gate-source capacitance of the transistor M2. On account of the fabrication method, the capacitances per area of the storage capacitor Cs and of the transistor M2 are e.g. of the same magnitude if the gate oxide and the capacitor dielectric are produced in the same dielectric layer and the layer has the same layer thickness at all points.

The area requirement of the memory cell 200 is determined by the requirements made of the effective storage capacitance Ceff. Given low leakage currents and a high transistor gain, which results in a high read current, it is possible to reduce the size of the storage capacitor Cs. The area required for the capacitor Cs and the electrical properties thereof are principal criteria for the economic fabrication of a memory unit having a multiplicity of memory cells 200. A memory unit having a multiplicity of memory cells 200 is also suitable for replacing an SRAM in a processor memory hierarchy.

In another exemplary embodiment, instead of the FinFET transistor, use is made of a multi-FinFET transistor containing, instead of just one web, a multiplicity of webs arranged parallel to one another between its drain terminal region and its source terminal region.

As a person skilled in the art will readily appreciate, the above description is meant as an illustration of implementation of the principles this invention. This description is not intended to limit the scope or application of this invention in that the invention is susceptible to modification, variation and change, without departing from the spirit of this invention, as defined in the following claims.

We claim:

1. A method for fabricating an integrated circuit arrangement with a capacitor, in which the following method steps are performed without any restriction by the order specified:
    providing a substrate containing an insulating layer made of electrically insulating material and a semiconductor layer, the insulating layer containing an insulating region,
    patterning the semiconductor layer in order to form at least one electrode region near the insulating region for a capacitor and in order to form at least one active region for a transistor,
    after the patterning of the semiconductor layer, producing at least one dielectric layer,
    after the production of the dielectric layer, producing an electrode layer, forming an electrode of the capacitor which is remote from the insulating region in the electrode layer,
    forming a control electrode of the transistor taking place at the same time as the formation of the electrode region remote from the insulating region, and
    the at least one electrode region near the insulating region containing a multiplicity of webs.

2. The method as claimed in claim 1, further comprising:
    applying at least one insulating layer to the semiconductor layer prior to patterning,
    doping the electrode region near the insulating region, or producing the dielectric layer at the same time as a dielectric layer at the active region of the transistor.

3. The method as claimed in claim 1, further comprising at least one of:
    producing an auxiliary layer after the production of the electrode layer, and
    patterning at least one of an electrode region remote from the insulating region or a control electrode of the transistor using the auxiliary layer as a hard mask.

4. The method as claimed in claim 1, further comprising at least one of:
    applying a further auxiliary layer after the patterning of a control electrode of the transistor, and
    anisotropically etching the further auxiliary layer.

5. The method as claimed in claim 1, further comprising at least one of:
    patterning the insulating layer such that a thickness of an auxiliary layer feeing is reduced, and
    anisotropic etching a further auxiliary layer after the patterning of the insulating layer.

6. The method as claimed in claim 1, further comprising at least one of:
    carrying out a selective epitaxy on uncovered regions made of semiconductor material after at least one of the formation of an electrode region remote form the insulating region or the patterning of a control electrode of the transistor, and
    doping terminal regions of the transistor after the patterning of the control electrode.

7. The method as claimed in claim 1, further comprising at least one of:
    removing an auxiliary layer, after at least one of the patterning of the insulating layer or after the carrying out of selective epitaxy, and
    selectively forming a metal-semiconductor compound, on at least one of the electrode layer or on uncovered semiconductor regions.

8. The method as claimed in claim 1, wherein the circuit arrangement contains at least one processor.

9. The method as claimed in claim 8, wherein the circuit arrangement contains a plurality of dynamic random access memory (DRAM) units.

10. The method as claimed in claim 1, wherein the capacitor and the active component form a memory cell.

11. The method as claimed in claim 10, wherein the memory cell contains a capacitor and only one transistor.

12. The method as claimed in claim 10, wherein the memory cell contains a capacitor and more than one transistor.

13. The method as claimed in claim 1, wherein the transistor is a FinFET.

* * * * *